(12) United States Patent
Namekawa

(10) Patent No.: US 6,650,574 B2
(45) Date of Patent: Nov. 18, 2003

(54) SEMICONDUCTOR DEVICE PREVENTING SIGNAL DELAY AMONG WIRINGS

(75) Inventor: Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/013,393

(22) Filed: Dec. 13, 2001

(65) Prior Publication Data

US 2003/0072189 A1 Apr. 17, 2003

(30) Foreign Application Priority Data

Oct. 11, 2001 (JP) ........................................ 2001-314165

(51) Int. Cl.$^7$ ................................................. G11C 7/00

(52) U.S. Cl. .................... 365/194; 365/63; 365/230.06; 365/230.08; 327/108; 327/261; 327/403

(58) Field of Search ....................... 365/63, 51, 230.03, 365/194, 230.06, 230.08; 327/403, 261, 108

(56) References Cited

U.S. PATENT DOCUMENTS

| 5,291,445 | A | * | 3/1994 | Miyaoka et al. | ........ 365/189.08 |
|---|---|---|---|---|---|
| 5,306,967 | A | * | 4/1994 | Dow | ........................... 326/101 |
| 5,994,946 | A | * | 11/1999 | Zhang | ........................ 327/403 |
| 6,094,701 | A | * | 7/2000 | Mochizuki et al. | ............ 711/5 |
| 6,115,301 | A | | 9/2000 | Namekawa | |
| 6,184,702 | B1 | * | 2/2001 | Takahashi et al. | ............. 326/21 |
| 6,243,317 | B1 | * | 6/2001 | Haga et al. | ............ 365/230.06 |
| 6,285,208 | B1 | * | 9/2001 | Ohkubo | ........................ 326/15 |
| 6,356,493 | B1 | * | 3/2002 | Kanetani et al. | ............ 365/203 |
| 6,396,150 | B2 | * | 5/2002 | Kohno | ........................ 257/758 |
| 6,452,421 | B2 | * | 9/2002 | Saito | ........................... 326/93 |

* cited by examiner

Primary Examiner—Richard Elms
Assistant Examiner—Toan Le
(74) Attorney, Agent, or Firm—Oblon, Spivak, McClelland, Maier & Neustadt, P.C.

(57) ABSTRACT

A plurality of wirings are arranged approximately in parallel. A first amplifier is arranged in one wiring of the two adjacent wirings which are included in the plurality of wirings. The first amplifier is arranged at least at a position which divides the interval of a predetermined distance of one wiring by approximately 1/n (n is an integer of two or more). The first amplifier is constituted by an odd number of inverter circuits.

17 Claims, 10 Drawing Sheets

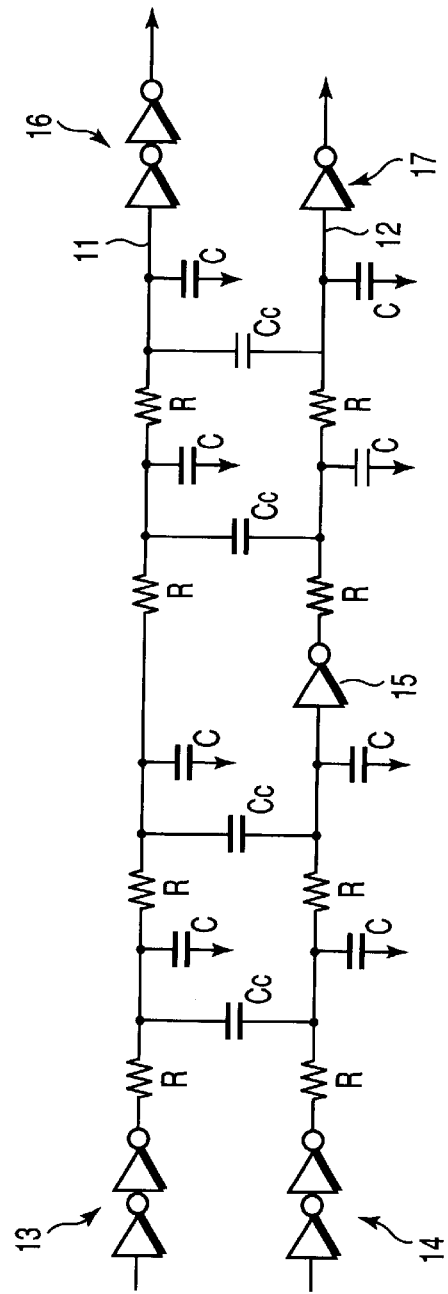
F I G. 1
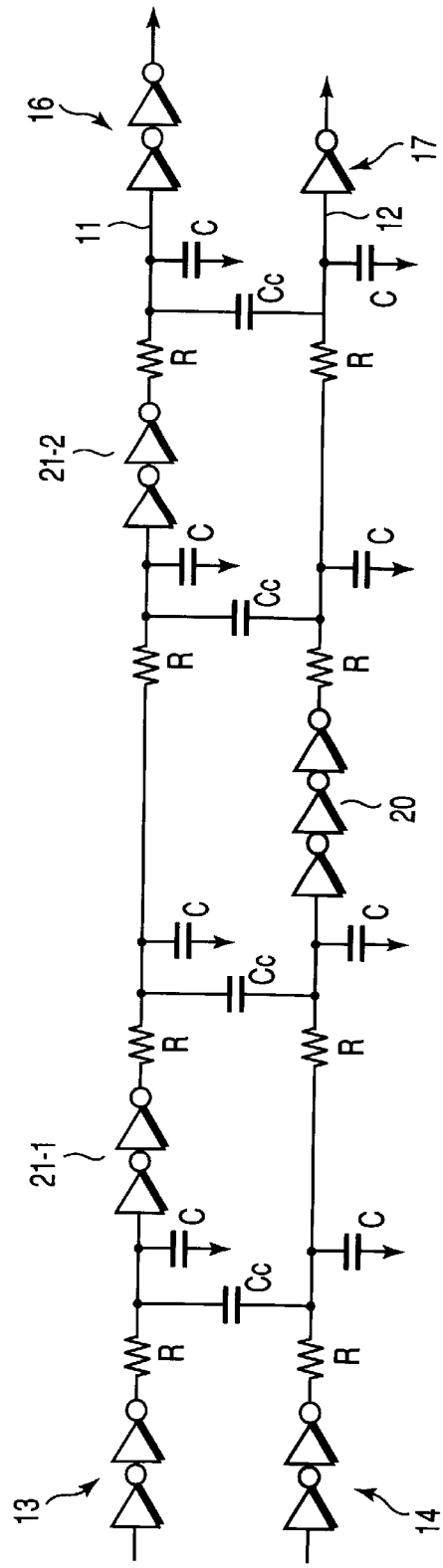
F I G. 4

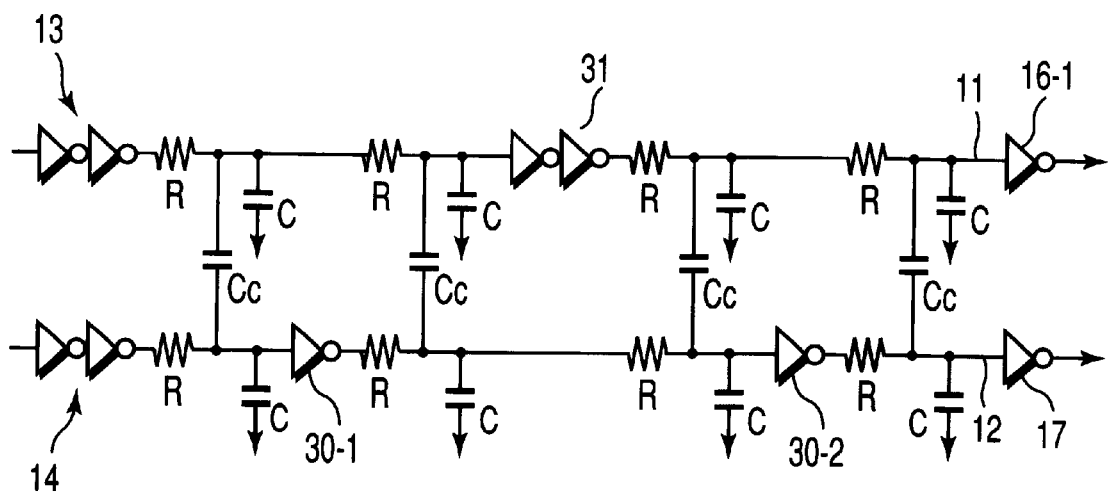
F I G. 7
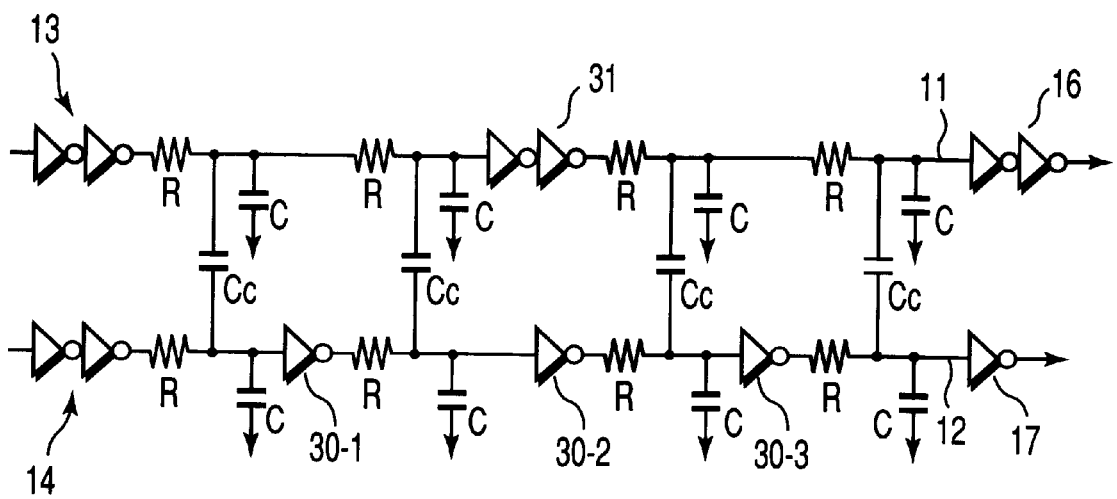
F I G. 8

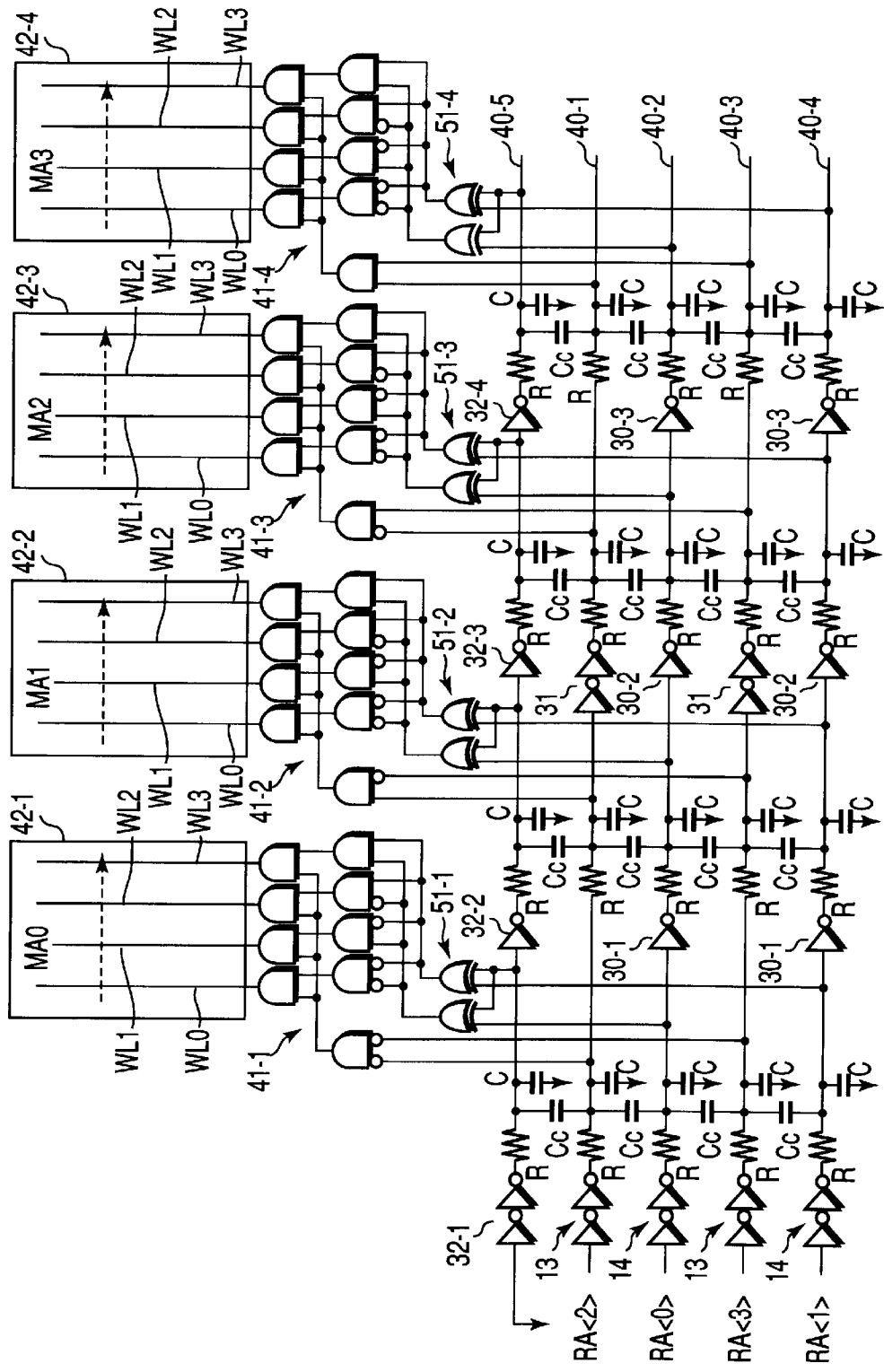
F I G. 10

Time difference between the transition times of the adjacent signals (sec.)

Time difference between the transition times of the adjacent signals (sec.)

SEMICONDUCTOR DEVICE PREVENTING SIGNAL DELAY AMONG WIRINGS

CROSS-REFERENCE TO RELATED APPLICATIONS

This application is based upon and claims the benefit of priority from the prior Japanese Patent Application No. 2001-314165, filed Oct. 11, 2001, the entire contents of which are incorporated herein by reference.

BACKGROUND OF THE INVENTION

1. Field of the Invention

The present invention relates to a semiconductor device adapted to, for example, a semiconductor memory, a logic circuit, an analogue circuit and the like.

2. Description of the Related Art

The processing technology for semiconductor devices has rapidly advanced in such a manner that it is now possible to form several hundreds of thousands of semiconductor devices within an area of 1 mm×1 mm. On the other hand, since the function of electronic equipment by which the semiconductor device is mounted has highly advanced, it is required for the semiconductor device of one chip has many functions. Thus, accompanying the increased number of functions is the related problem of chip size, which needs to be increased as a result. What is desired, however, is a size reduction.

Also, accompanying the increased chip size is the increased length of wiring inside the semiconductor device. Further, due to this fine processing, the current driving capacity of semiconductor devices has been improved and loads, such as gate capacitance, have been reduced. As a result, there are many cases where the operating speed of the semiconductor device depends on the signal delay in the wiring, rather than on the gate capacitance. Accordingly, in order to allow a semiconductor device to operate at high speed, it is required to reduce the signal delay in the wiring.

This signal delay is considered to have two causes. The first is the parasitic capacitance present in each wire and the second is the parasitic capacitance resulting from a plurality of activated wirings.

In order to control delays due to the first cause, a technology such as re-drive of the wiring, in which an amplifier is inserted in the middle of the wiring, can be used. For this reason, the solution is relatively simple. That is, the delay time of the wiring can be estimated from the product of resistance and capacitance of the wiring. For example, when a wiring resistance is taken as R and wiring capacity as C, the delay time τ of the wiring is expressed by the following formula:

$$\tau = kRC$$

wherein k is a reasonable constant.

On the other hand, when the amplifier is inserted in the middle of the wiring, the delay time $\tau_2$ of the wiring is expressed by the following formula:

$$\tau_2 = k(R/2 \cdot C/2) + k(R/2 \cdot C/2)$$

$$\tau_2 = \tau/2$$

In this way, by inserting the amplifier in the middle of the wiring and re-driving the wiring, it is possible to reduce the delay time of the signal propagated in the wiring by half the delay time of the case of the wiring only.

On the other hand, the delay time due to the second cause changes depending on the time relationship of the signals propagated respectively in a plurality of activated wirings. For this reason, it is difficult to control the delay time due to the second cause. This will be described below.

FIG. 13 shows two ordinary wirings adjacent to each other. Each wiring 11, 12 has a resistance R and a parasitic capacity C, and a parasitic capacity Cc is coupled between the wiring 11 and the wiring 12. These parasitic capacities are distributed capacities, and FIG. 13 shows these distributed capacities by reference characters C, Cc for the sake of explanation. Drivers 13, 14 having a current drive capacity of Idrv are inserted into each wiring 11, 12. These drivers 13, 14 are constituted by an inverter circuit, for example, having two stages.

In the circuit constituted as described above, the delay time $\tau_{same}$ in driving each wiring 11, 12 by the drivers 13, 14 in the same direction and the delay time $\tau_{opposite}$ in driving in a different direction were simulated by using a circuit simulator.

FIG. 14 shows a simulation result of the circuit shown in FIG. 13. In FIG. 14, the abscissa shows a transition time of the signal propagating in the adjacent wiring with a time difference "0" as a center. The ordinate shows the delay time of the signal propagating there. A minimum value of the delay time $\tau_{same}$ is approximately 250 p second, and the maximum value of the delay time $\tau_{opposite}$ is approximately 700 p second, and the difference between both of them amounts to approximately 450 p second. That is, corresponding to the operation of the signal propagating in the adjacent wiring, the delay time of the signal fluctuates within a range of two or more times the minimum value.

As described above, regarding the delay attributable to the parasitic capacity among a plurality of wirings, it is difficult to reduce the delay time only by inserting the amplifier in the middle of the wiring and re-driving the wiring.

That is, as shown in FIG. 15, amplifiers 13-1, 14-1 constituted by two inverter circuits are inserted in the middle of the wirings 11, 12. In this constitution, by using the circuit simulator, a simulation was made similarly to the previous simulation.

FIG. 16 shows a simulation result of the circuit shown in FIG. 15. The difference between the delay time $\tau_{same}$ and the delay time $\tau_{opposite}$ is approximately 350 p second and, compared to the result shown in FIG. 14, the fluctuation of the delay time is slightly reduced. However, the delay time in the worst condition in which the adjacent wiring operates in an antiphase in the entirely same timing is approximately 700 p second and does not differ from the result shown in FIG. 14.

The re-drive technology of the wiring can narrow a range of the time difference of the signal due to the parasitic capacity among the wirings. However, it is not possible to control the magnitude of the delay time of the signal in the worst condition in which the signal of the adjacent wiring transits at approximately the same time and the magnitude of the fluctuation as a difference between the maximum value and the minimum value within the delay time in the same phase time and the delay time in the antiphase time (which includes a difference between the maximum value and the minimum value of the delay time in both the same phase time and the antiphase time, a difference between the maximum value and the minimum value of the delay time in the same phase time and a difference between the maximum value and the minimum value of the delay time in the antiphase time).

The most effective means as a method of controlling the influence of the coupling between the wirings is to provide a shield wire so as to reduce the coupling between the wirings. However, in this case, an extra wiring area is required for the purpose of shielding. In recent semiconductor devices, the main factor which decides the chip area is the wiring. In other words, the method of providing the shield wire creates the problem of increasing the tip area, thereby increasing the cost.

BRIEF SUMMARY OF THE INVENTION

According to an aspect of the invention, there is provided a semiconductor device comprising: a plurality of wirings which are arranged approximately in parallel and propagate a signal; and a first amplifier arranged in one wiring of two adjacent wirings which are included in a plurality of wirings, the first amplifier being arranged at least at a position which divides the interval of a predetermined distance of one wiring by 1/n (n is an integer of two or more) and being constituted by an odd number of inverter circuits.

BRIEF DESCRIPTION OF THE SEVERAL VIEWS OF THE DRAWING

FIG. 1 is a circuit diagram showing a first embodiment of the present invention;

FIG. 4 is a circuit diagram showing a second embodiment of the present invention;

FIG. 7 is a circuit diagram showing a third embodiment of the present invention;

FIG. 8 is a circuit diagram showing a fourth embodiment of the present invention;

FIG. 10 is a circuit diagram showing a sixth embodiment of the present invention;

DETAILED DESCRIPTION OF THE INVENTION

The embodiments of the present invention will be described below with reference to the drawings.
(First Embodiment)

Figure 13:
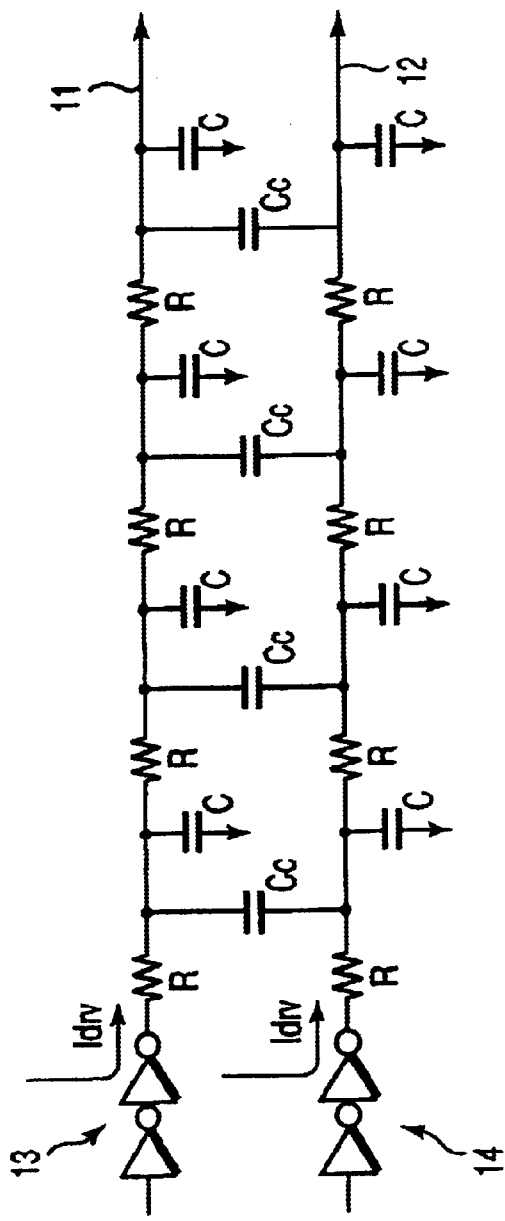
FIG. 13 is a circuit diagram showing two ordinary adjacent wirings.
Figure 15:
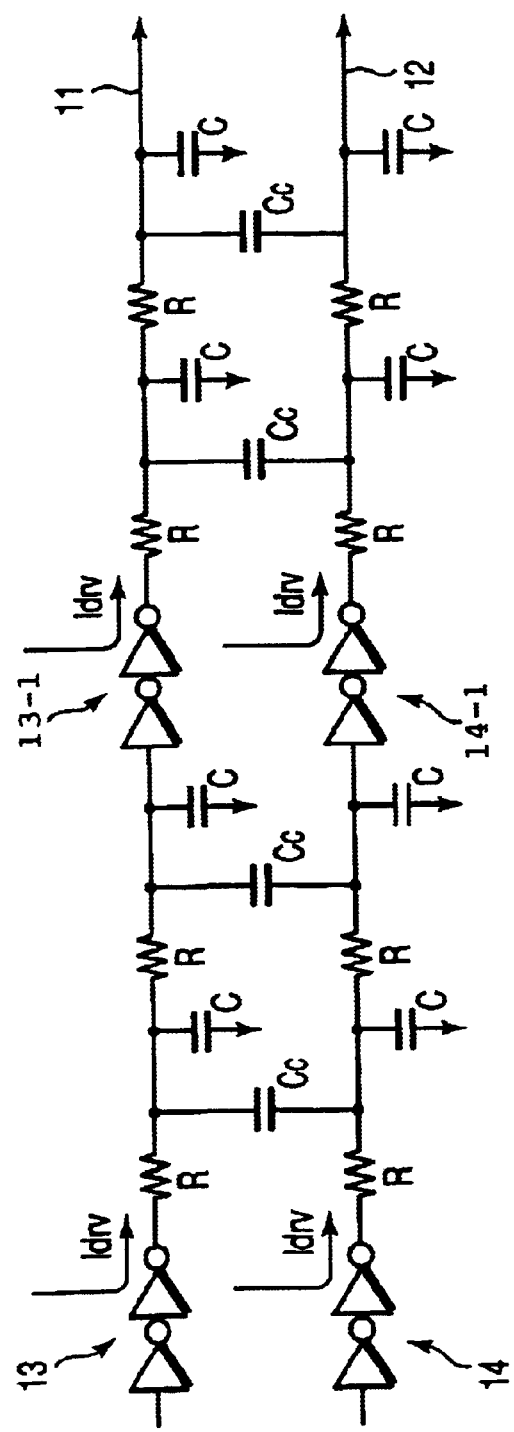
FIG. 15 is a circuit diagram showing the case where an amplifier constituted by a two stage inverter in the middle of the wiring is connected.

FIG. 1 shows a first embodiment of the present invention, and the same components as those of FIGS. 13, 15 are attached with the same reference numerals.

In FIG. 1, two wirings (signal wirings) 11, 12 are arranged approximately in parallel. One end of the wiring 11 is connected to a driver 13 having a current drive capacity of Idrv, and one end of the wiring 12 is connected to a driver 14 having a current drive capacity of, for example, Idrv/2. These drivers 13, 14 are constituted by, for example, two inverter circuits connected in series. For example, at an interval of a predetermined distance of the wiring 12 from among the wirings 11, 12, for example, at the approximate mid position of the total length, an amplifier 15 constituted by the odd number of, for example, one inverter circuit is inserted. In general, the inserted position of the amplifier may be at least one position, which divides the total length of the wiring 12 approximately into 1/n (n is an integral number of two or more).

The other end of the wiring 11 is connected to a driver 16 having, for example, the current drive capacity of Idrv. Also, the other end of the wiring 12 is connected to a signal reverse amplifier 17 constituted by, for example, one inverter circuit. The current drive capacity of the amplifier 15, similarly to the driver 14, has, for example, a current drive capacity of Idrv/2. That is, in FIG. 1, the capacity of the wiring connected to output terminals of the driver 14 and the amplifier 15 is approximately ½ the capacity of the wiring connected to the output terminal of the driver 13. For this reason, the current drive capability of the driver 14 and the amplifier 15 are suitably set according to the capacities of the wirings connected to them.

In the constitution, a simulation was made regarding the delay time $\tau_{same}$ in the case where the signals of the wirings 11, 12 operated in the same phase direction and the delay time $\tau_{opposite}$ in the case where the signals operated in the antiphase direction.

Figure 2:
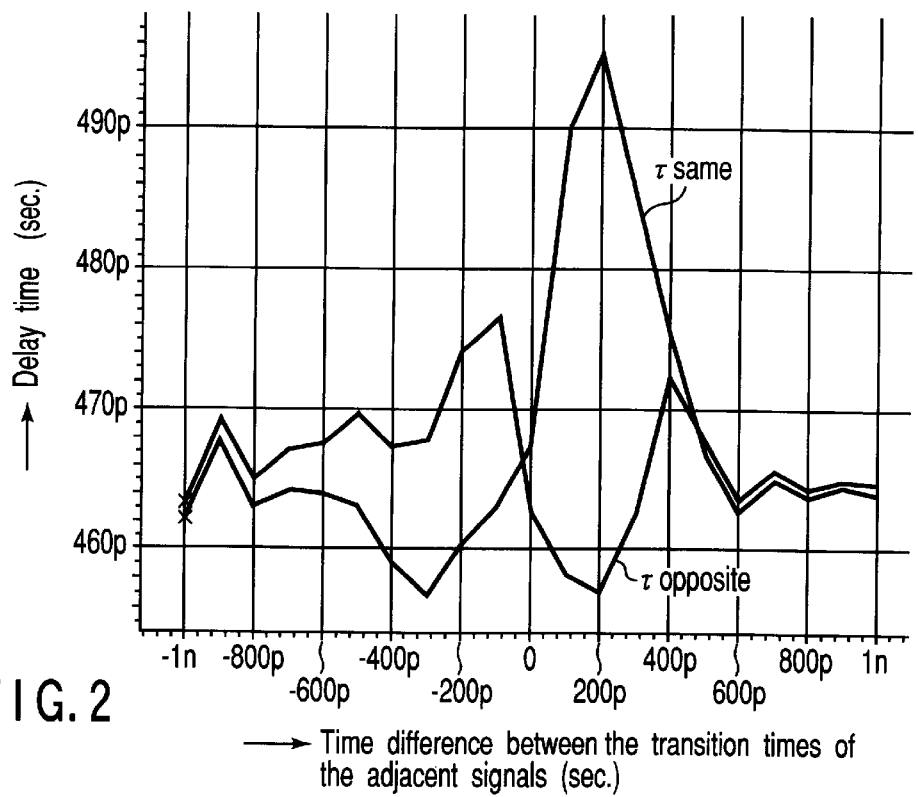
FIG. 2 is a waveform chart showing a simulation result of a wiring 12 shown in FIG. 1.
Figure 3:
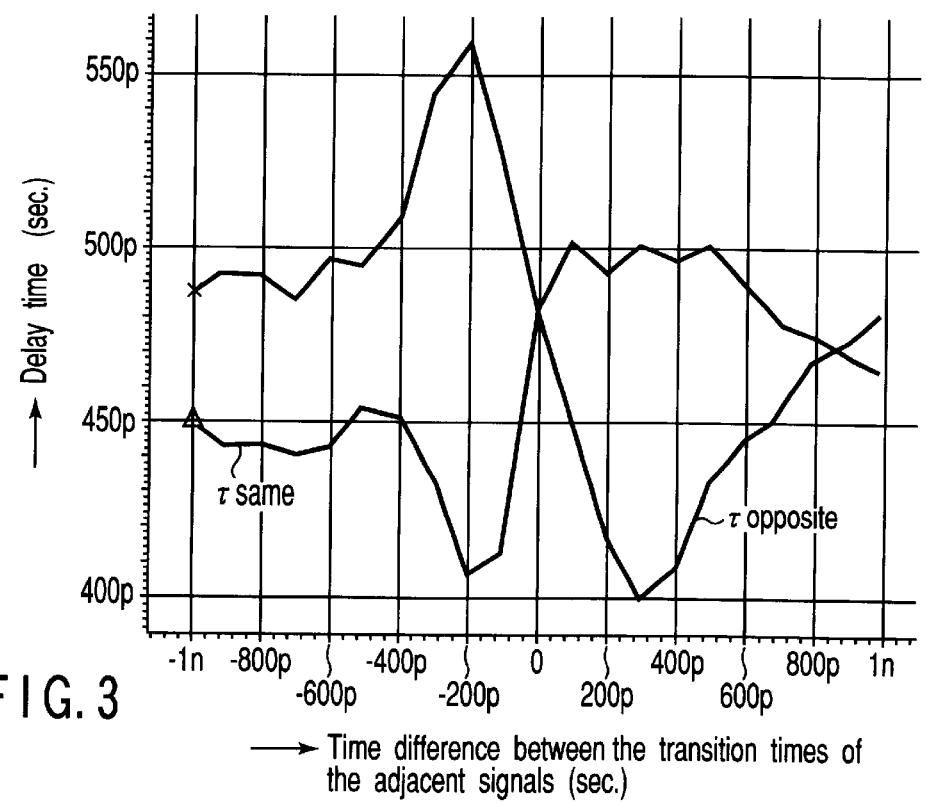
FIG. 3 is a waveform chart showing a simulation result of a wiring 11 shown in FIG. 1.
Figure 16:
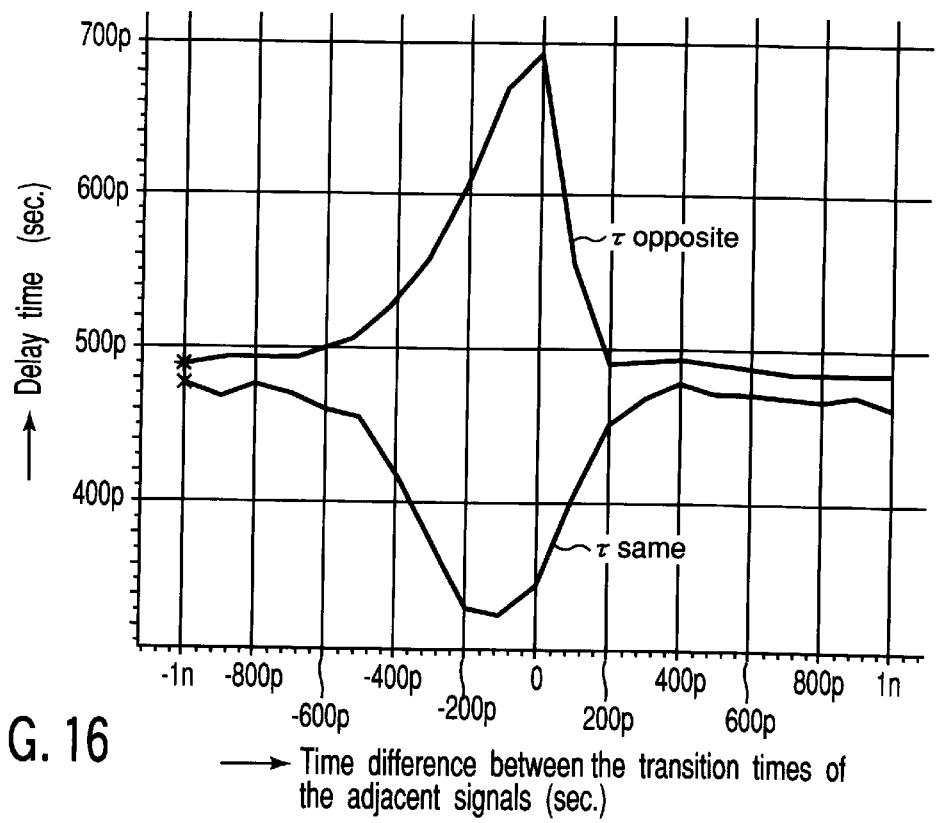
FIG. 16 is a waveform chart showing a simulation result of the circuit shown in FIG. 15.

FIG. 2 shows a simulation result of the wiring 12 shown in FIG. 1, and FIG. 3 shows a simulation result of the wiring 11 shown in FIG. 1. The abscissa shows the time difference of a transit time of the signal propagating in the adjacent wiring, and the ordinate shows the delay time of a signal transmission. As shown in FIG. 2, the minimum value of the delay time of the wiring 12 in which the amplifier 15 was inserted is approximately 460 p second in both the same phase time and the antiphase time, and the maximum value is approximately 500 p second in the same phase time. Further, the fluctuation as a difference between the maximum value and the minimum value of the delay time is approximately 40 p second and, compared to FIGS. 14 and 16, is largely reduced.

Further, the minimum value of the delay time of the wiring 11 shown in FIG. 3 is approximately 400 p second in both the same phase time and the antiphase time, and the maximum value is 550 p second in the antiphase time. The fluctuation is approximately 150 p second and reduced similarly to the wiring 12.

Figure 14:
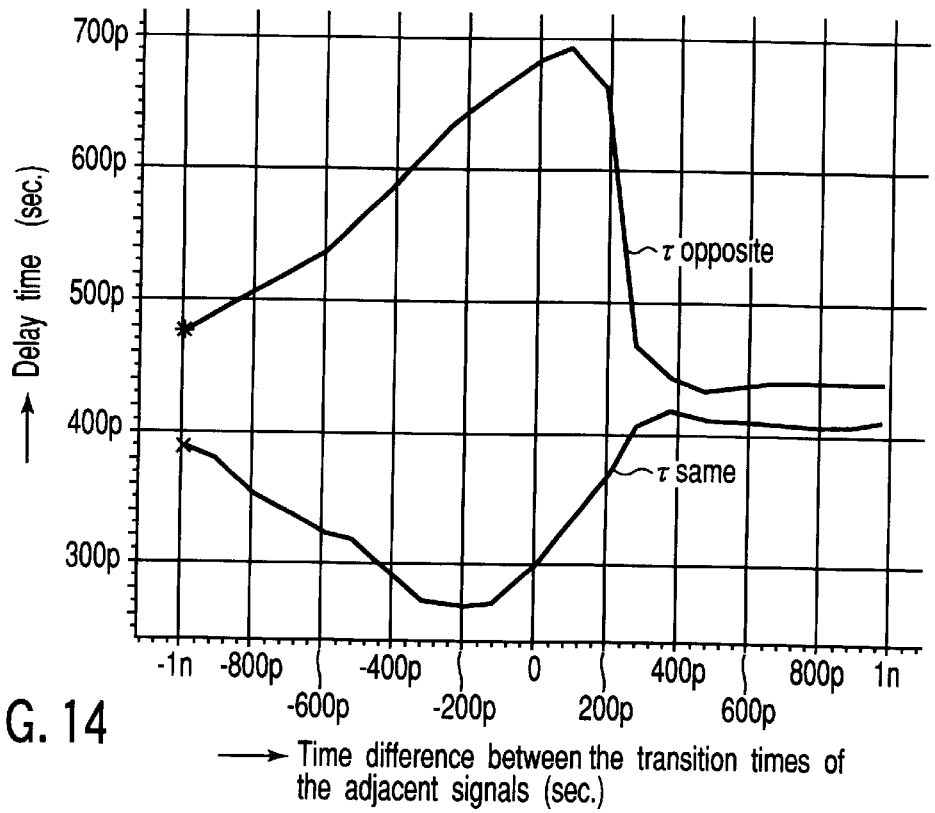
FIG. 14 is a waveform chart showing a simulation result of the circuit shown in FIG. 13.

The fluctuation of the delay time due to the capacity coupling of the wirings 11, 12 before the amplifier is inserted was approximately 450 p second as shown in FIG. 14. Accordingly, by inserting the amplifier 15 in the middle portion of the wiring 12, it is possible to largely reduce the fluctuation of the delay time.

That is, by inserting the amplifier 15 in the middle portion of the wiring 12, the charge and discharge current of an inter wiring parasite capacity Cc at the input side of the amplifier 15 and the charge and discharge current of the inter wiring parasite capacity Cc at the output side of the amplifier 15 are mutually turned in the reverse direction. For this reason, the charge and discharge currents of these inter wiring parasite capacities are mutually offset so that the inter wiring parasite capacities are possibly controlled to a smaller degree.

According to the first embodiment, the amplifier 15 constituted by one inverter circuit is provided in the middle portion of the wiring 12 from among the wirings 11, 12 which are arranged approximately in parallel so that the influence of the inter wiring parasite capacities at the input side and the output side of this amplifier is offset. For this reason, the maximum value of the delay time of the signal propagated in the wiring can be reduced and, further, it is possible to reduce the fluctuation of the delay time, thereby making high speed operation of the semiconductor device possible.

Further, according to the configuration of the first embodiment, the shield wire for reducing the inter-wiring parasitic capacity and a wide wiring space are not required. Accordingly, it is possible to decrease the chip area, prevent a rise in cost and realize a wiring of high density.

Furthermore, the current drive capability of the driver 14 and the amplifier 15 are set according to the capacities of the wirings which are connected to them. For this reason, the necessary range of the wiring can be driven by the driver and the amplifier having the required minimum current drive capability. It is therefore possible to prevent an upsizing of the circuit constitution.

(Second Embodiment)

FIG. 4 shows a second embodiment of the present invention, and the same components as those of the first embodiment are attached with the same reference numerals. In the second embodiment, at interval of a predetermined distance of the wiring 12, for example, at the position of approximately half of the total length, an amplifier 20 is inserted and connected. This amplifier 20 is configured the odd number of, for example, three inverter circuits. Furthermore, at an interval of a predetermined distance of the wiring 11, for example, at an approximately ¼ position of the total length, an amplifier 21-1 is connected and, at an approximately ¾ position, an amplifier 21-2 is connected. These amplifiers 21-1, 21-2 are constituted of an even number of, for example, two inverter circuits. In the constitution, the same simulation as that of the first embodiment was executed. In general, the inserted position of the amplifiers 21-1, 21-2 may be at least one position, which divides the total length of the wiring 11 in 1/n (n is the integral number of two or more). The current drive capability of the drivers 13, 14 and the amplifiers 20, 21-1, 21-2 are suitably set according to the capacities of the driving wiring and have the current drive capability of at least Idrv/n.

Figure 5:
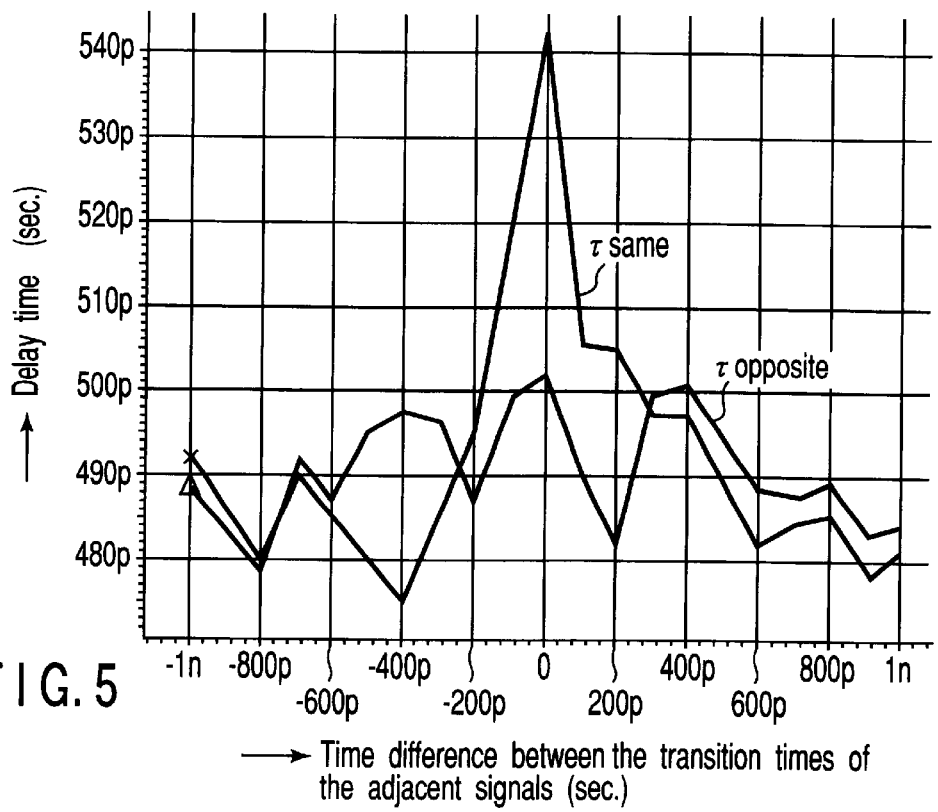
FIG. 5 is a waveform chart showing a simulation result of a wiring 12 shown in FIG. 4.
Figure 6:
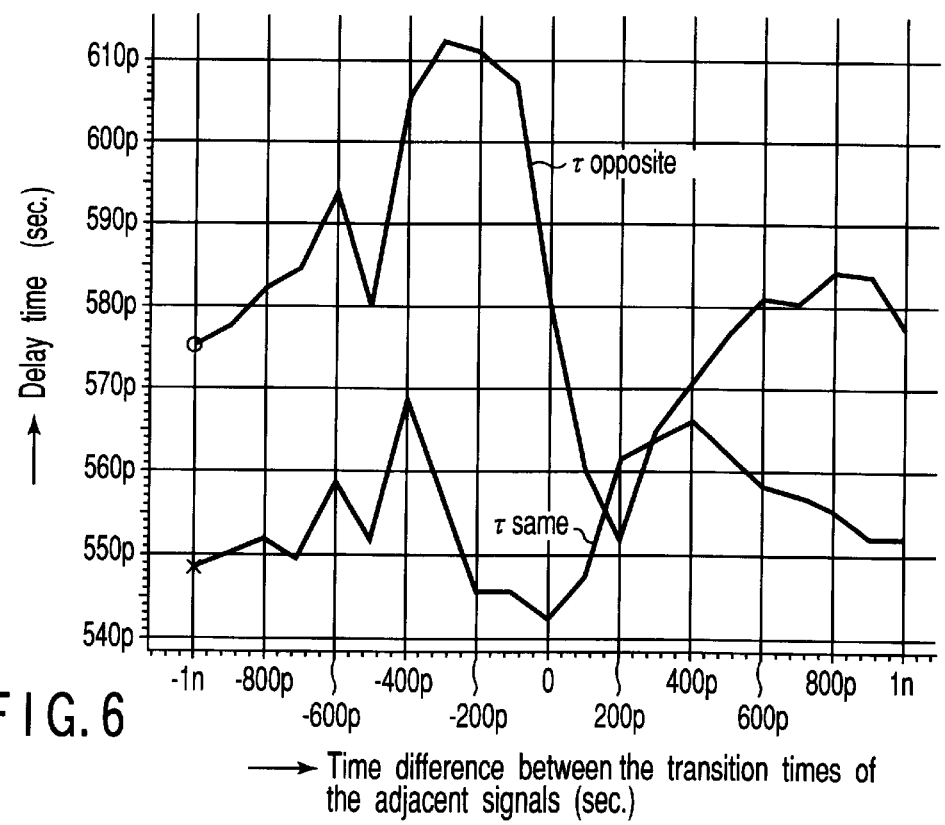
FIG. 6 is a waveform chart showing a simulation result of a wiring 11 shown in FIG. 4.

FIG. 5 shows a simulation result of the wiring 12 shown in FIG. 4, and FIG. 6 shows a simulation result of the wiring 11 shown in FIG. 4. As shown in FIG. 5, the minimum value of the delay time of the wiring 11 is approximately 480 p second, and the maximum value is approximately 540 p second. The fluctuation is approximately 60 p second.

The minimum value of the delay time of the wiring 11 shown in FIG. 6 is approximately 540 p second, and the maximum value is approximately 610 p second. The fluctuation is approximately 70 p second.

In the second embodiment, the fluctuation of the delay time and the delay of the wiring 12 are slightly increased, compared to the first embodiment. However, the delay time of the wiring 11 is approximately the same as the delay time of the wiring 12 and, further, the fluctuation of the delay time of the wiring 11 is controlled to a small value, compared to the first embodiment.

In this way, according to the second embodiment, compared to the first embodiment, a large number of amplifiers are inserted into the wirings 11, 12. For this reason, it is possible to largely control the influence of the capacity coupling of the adjacent wirings 11, 12 and control the delay time of the signal wire and the fluctuation of the delay to a lesser degree.

(Third Embodiment)

FIG. 7 shows a third embodiment of the present invention, and the same components as those of the first and the second embodiments are attached with the same reference numerals. In the third embodiment, at intervals of a predetermined distance of the wiring 12, for example, at an approximately ¼ position of the total length, an amplifier 30-1 is connected and, at an approximately ¾ position, an amplifier 30-2 is inserted and connected. These amplifiers 30-1, 30-2 are constituted by, for example, one inverter circuit.

Further, at intervals of a predetermined distance of the wiring 11, for example, at the position of approximately half of the total length, an amplifier 31 is inserted. This amplifier 31 is constituted by, for example, two inverter circuits. In this embodiment, an amplifier 16-1 connected to the other end of the wiring 11 is constituted by, for example, one inverter circuit.

In the third embodiment also, the same effect as that of the second embodiment can be obtained. Further, as in the first and second embodiments, when the one amplifier constituted by the inverter circuit having an odd number of stages is connected to the wiring 12, the polarity of the signal of the wiring 12 is reversed. However, in the case of the third embodiment, the even number of the amplifier constituted by an odd number of inverter circuits is inserted in the wiring 12. For this reason signal reversal of the signal can be prevented.

(Fourth Embodiment)

FIG. 8 shows a fourth embodiment of the present invention, and the same components as those of the first to the third embodiments are attached with the same reference numerals. In the fourth embodiment, at intervals of a predetermined distance of the wiring 12, for example, at each position dividing the total length into four equal parts, the amplifiers 30-1, 30-2, 30-3 are inserted and connected. The amplifiers 30-1, 30-2, 30-3 are constituted respectively by, for example, one inverter circuit. Further, at intervals of a predetermined distance of the wiring 11, for example, at the position of approximately half of the total length, the amplifier 31 is inserted and connected.

Even by the forth embodiment, the same effect as that of the third embodiment can be obtained. Further, in the case of the fourth embodiment, since it is good enough if the amplifiers 30-1, 30-2, 30-3 are inserted at the positions which divide the wiring 12 into four equal parts, the arrangement of the amplifiers is easy, compared to the second and the third embodiments. Further, the number of amplifiers inserted in the wiring 12 is not limited to three, but may be four or more. In this case, every time two of the odd number of amplifiers are arranged at equal intervals in the wiring 12, the even number of amplifiers are arranged in the wiring 11, and this process may be repeated in order. Accordingly, the amplifiers can be easily arranged for a long wire.

(Fifth Embodiment)

Figure 9:
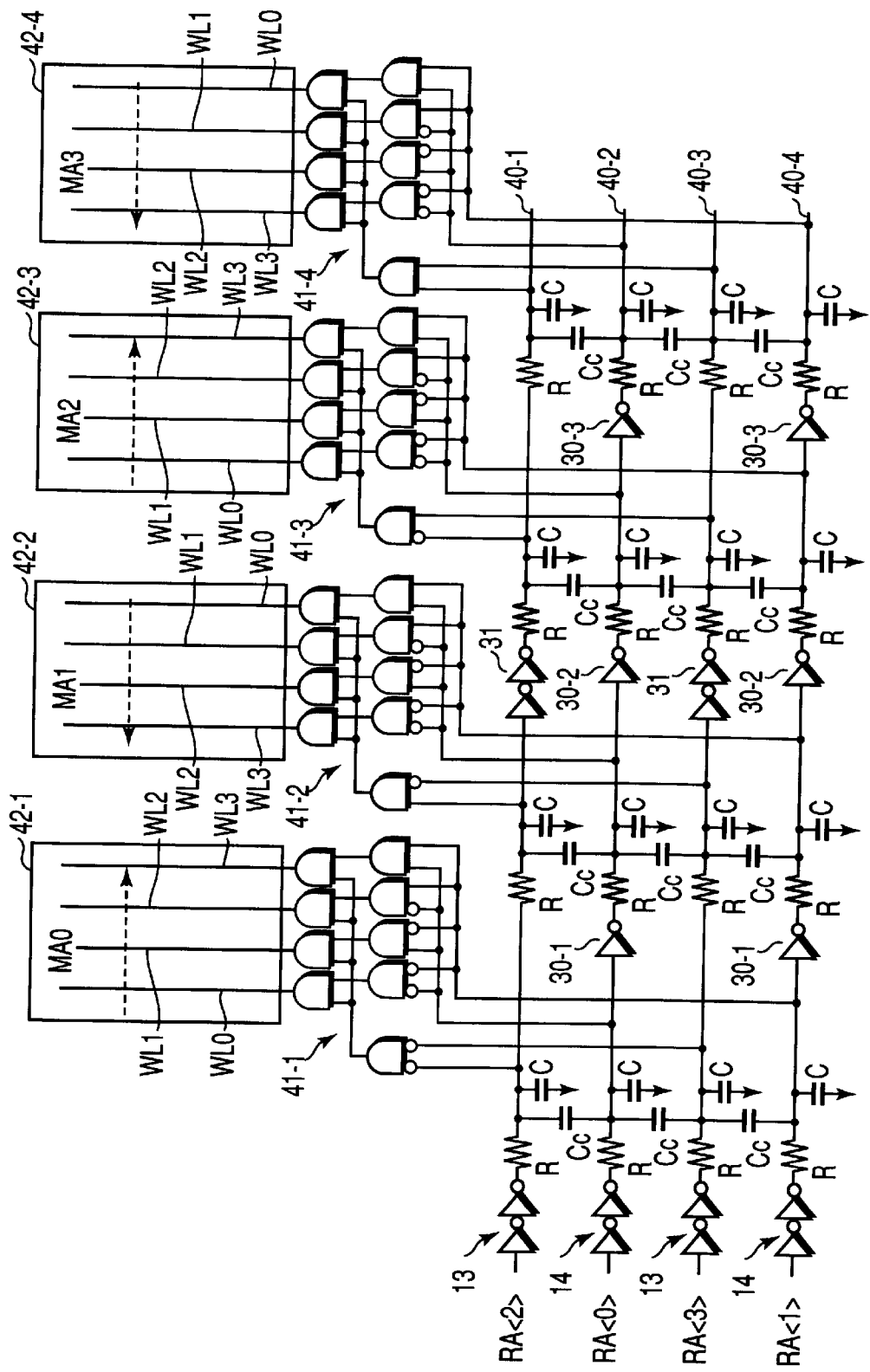
FIG. 9 is a circuit diagram showing a fifth embodiment of the present invention.

FIG. 9 shows a fifth embodiment of the present invention, and the same components as those of the fourth embodiment are attached with the same reference numerals.

The fifth embodiment is an example in which the present invention was adapted to a semiconductor memory. In general, the semiconductor memory has a number of buses or wirings of a wide bit width, such as an address line or a data line. These wirings are connected to a plurality of circuits on the chip. For this reason, due to the influence of the capacity coupling of the wirings arranged approximately in parallel and the difference in the wiring length, a skew is generated on the signal propagated in these wirings, so high speed operation becomes difficult. Thus, in the fifth embodiment, for example, the signal delay of the address line used for the semiconductor memory is eliminated.

FIG. 9 schematically shows a constitution of the semiconductor memory. In order to simplify the description of FIG. 9, four memory cell arrays 42-1, 42-2, 42-3, 42-4 are shown. A description will be made of the case where each memory cell array 42-1, 42-2, 42-3, 42-4 has four word lines WL0 to WL3. However, it is not limited to this constitution.

For each memory cell array 42-1, 42-2, 42-3, 42-4, low decoders 41-1, 41-2, 41-3, 41-4, which select the word lines WL0 to WL3, are correspondingly arranged. These low decoders 41-1 to 41-4 are connected to upper address lines 40-1, 40-3 and lower address lines 40-2, 40-4. These address lines 40-1, 40-2, 40-3, 40-4 are mutually arranged approximately in parallel. Lower address signals RA<0>, RA<1> having two bits are supplied to the lower address lines 40-2, 40-4, respectively. Upper address signals RA<2>, RA<3> having two bits are supplied to the upper address lines 40-1, 40-3, respectively. The lower address signals RA<0>, RA<1> are used for selecting one word line from four word lines. Also, the upper address signals RA<2>, RA<3> are used for selecting one memory cell array from four memory cell arrays.

The lower address lines 40-2, 40-4 are connected respectively to the amplifiers 30-1, 30-2, 30-3, which are constituted by an odd number of, for example, one inverter circuits. The upper address lines 40-1, 40-3, are connected to the amplifiers 31, which are constituted by the even number of, for example, two of the inverter circuit. The arrangement condition of these amplifiers 30-1, 30-2, 30-3 and 31 is the same as that of the fourth embodiment. That is, the amplifiers 30-1, 30-2, 30-3 are arranged respectively at intervals of a predetermined distance of the lower address lines 40-2, 40-4, for example, at each location of approximately ¼, ²⁄₄ and ¾ of the total length, and the amplifiers 31 are arranged at intervals of a predetermine distance of the upper address lines 40-1, 40-3, for example, at the position of approximately ½ of the total length.

The input terminals of the each low decoder 41-1, 41-2, 41-3, 41-4 are connected to the positions corresponding to the lower address lines 40-2, 40-4 divided into four equal parts and to the positions corresponding to the upper address lines 40-1, 40-3 divided into two equal parts.

In the constitution, the logic of the lower address signal is reversed every time the signal passes through the amplifier which is constituted by the odd number of inverter circuits and inserted into the lower address lines 40-2, 40-4. In the case of the fifth embodiment, the logic of the lower address signal may be either positive or negative. When the logic of each bit of the address signal is reversed, as shown by the arrow of a dashed line in the memory cell arrays 42-1, 42-2, 42-3, 42-4, the selection sequence of the word line is reversed. However, the selection sequence of the word line is not so important for the operation.

According to the fifth embodiment, a plurality of amplifiers 30-1, 30-2, 30-3 constituted by the odd number of inverter circuits are arranged in the lower address lines 40-2, 40-4 in which the lower address signal selecting the word line is propagated, and the amplifier 31 constituted by the odd number of inverter circuits is arranged in the upper address lines 40-1, 40-3 in which the upper address signal is propagated. For this reason, the lower address lines 40-2, 40-4 and the upper address lines 40-1, 40-3 have positive and negative capacity couplings which are mutually offset. That is, regardless of how the address signal transits, each address line shows a delay time of the same degree. Accordingly, the skew of the signal propagating in each address line can be prevented and a decoding time of the low decoder can be shortened so that high speed selection operation of the word line can be realized.

(Sixth Embodiment)

FIG. 10 shows a sixth embodiment of the present invention, and the same components as those of the FIG. 9 are attached with the same reference numerals, and the different components only will be described below.

In the fifth embodiment, the selection sequence of the word line has been reversed for every adjacent memory cell array. In contrast to this, the sixth embodiment performs the selection sequence of the word line in each memory cell in the same direction.

That is, in FIG. 10, in the vicinity of, for example, the upper address line 40-1, a decoding wiring 40-5 for propagating a decoding signal, which corrects the logic of the address signal, is arranged approximately in parallel to the upper address line 40-1. This decoding wiring 40-5 has the same constitution as that of the lower address lines 40-2, 40-4.

That is, the decoding wiring 40-5 has the same wiring length as that of the lower address lines 40-2, 40-4. One end portion of this decoding wiring 40-5 is connected to an output terminal of a driver 32-1 which is constituted by, for example, two inverter circuits. An input terminal of this driver 32-1 is grounded. Further, at interval of a predetermined distance of the decoding wiring 40-5, that is, at the positions of, for example, approximately ¼, ²⁄₄ and ¾ of the total length, amplifiers 32-2, 32-3, 32-4, which are constituted by an odd number of, for example, one inverter circuit, are inserted and connected.

Further, in the decoders 41-1, 41-2, 41-3, 41-4, preceding stages of the circuit for decoding the lower address are connected respectively to the output terminals of decoding circuits 51-1, 51-2, 51-3, 51-4 for decoding the address signal. These decoding circuits 51-1, 51-2, 51-3, 51-4 are constituted by, for example, two exclusive or circuits. Input terminals of these decoding circuits 51-1, 51-2, 51-3, 51-4 are connected respectively to the positions corresponding to the lower address lines 40-2, 40-4 which are divided into four equal parts by the amplifiers 30-1, 30-2, 30-3 and the positions corresponding to the decoding wiring 40-5 which is divided into four equal parts by the amplifiers 32-2, 32-3, 32-4.

As described above, the lower address lines 40-2, 40-4 are re-driven by the amplifiers 30-1, 30-2, 30-3 constituted by an odd number of inverter circuits. For this reason, the logic thereof is reversed every time they are re-driven.

However, according to the sixth embodiment, the decoding circuits 51-1, 51-2, 51-3, 51-4 decode the lower address signal according to the logic of the corresponding place of the decoding wiring 40-5. Accordingly, the selection sequence of the word lines in each memory cell array can be made in the same direction.

Incidentally, the sixth embodiment described the case where the present invention was adapted to the address line propagating the row address signal. However, the invention is not limited to this, but can be also adapted to the address line propagating a column address signal. In this case, the skew of the column address line can be eliminated, thereby contributing to high speed operation of the semiconductor memory.

(Seventh Embodiment)

Figure 11:
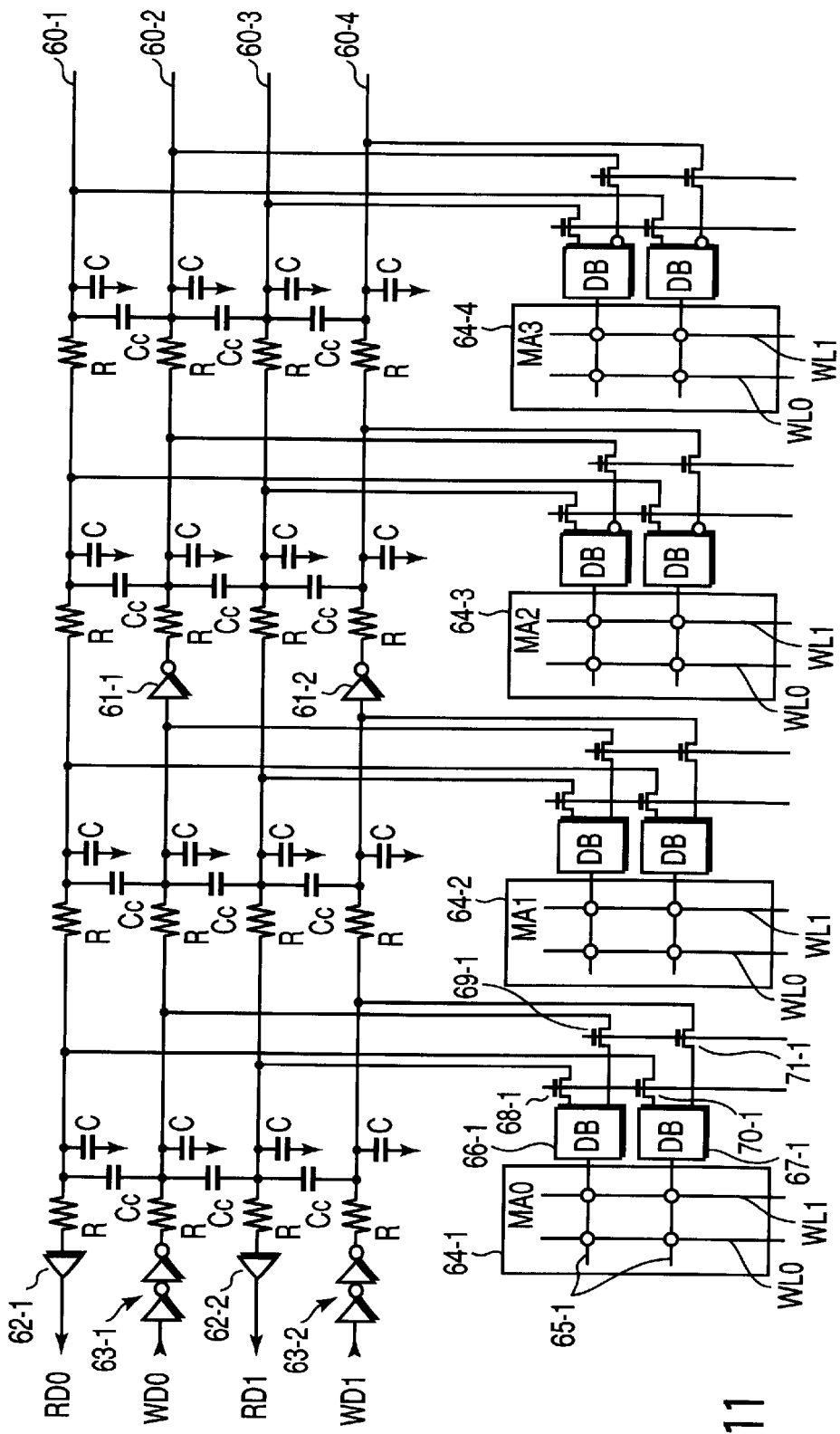
FIG. 11 is a circuit diagram showing a seventh embodiment of the present invention.

FIG. 11 shows a seventh embodiment of the present invention. The seventh embodiment is an example in which the present invention was adapted to, for example, the data line of the semiconductor memory.

For example, a memory embedded in a logic LSI has a data line having a large band width so that it can be connected to the logic circuit. This data line is constituted by a data bus having, for example, 128 to 256 wirings. In order to lay the data bus having many such wirings in a narrow area, it is necessary to make the wiring pitch small. Further, a data line for writing and a data line for reading are laid next to each other and these lines should be able to operate simultaneously. For this reason, due to parasite capacity coupling between adjacent wirings, the situation arises in which a propagation delay of the signal occurs and high speed operation becomes difficult. The seventh embodiment solves this problem.

In order to make the description easily understood, the seventh embodiment shows a small scale semiconductor memory constituted by the two bit data line.

As shown in FIG. 11, this semiconductor memory is constituted by four memory cell arrays 64-1, 64-2, 64-3, 64-4. Since each memory cell array and the adjacent circuit have the same constitution, the memory cell array 64-1 alone will be described below.

That is, the memory cell array 64-1 is provided with, for example, two local data buffers (DB) 66-1, 67-1. These local data buffers 66-1, 67-1 have a function of amplifying and reading a micro signal of a local data line 65-1 laid inside the memory cell array 64-1 and a function of propagating data supplied from the writing data lines 60-2, 60-4 to the local data line 65-1. Between the local data buffers 66-1, 67-1 and reading data lines 60-1, 60-3, switch circuits 68-1, 70-1 are connected. Also, between the local data buffers 66-1, 67-1 and the reading data lines 60-2, 60-4, switch circuits 69-1, 71-1 are connected.

Two reading data lines 60-1, 60-3 and two writing data lines 60-2, 60-4 are arranged approximately in parallel along the memory cell arrays 64-1, 64-2, 64-3, 64-4. One end of the writing data lines 60-2, 60-4 are connected to output terminals of the drivers 63-1, 63-2. One end of the reading data lines 60-1, 60-3 are connected to input terminals of sense amplifiers 62-1, 62-2. The writing data lines 60-2, 60-4 and the reading data lines 60-1, 60-3 have the same wiring length and are laid next to each other. For this reason, the writing data lines 60-2, 60-4 and the reading data lines 60-1, 60-3 have a capacity coupling over each other.

In the constitution, in order to realize high speed operation, it is necessary to reduce the signal delay due to the capacity coupling between the adjacent wirings in writing operation immediately after reading. As a technology for making high speed operation possible, there is a pipeline operation. This pipeline operation will be described with reference to FIG. 11.

First of all, a data of the memory cell not shown is read to the local data line 65-1. Next, the data read to the local data line 65-1 is propagated in the reading data lines 60-1, 60-3 through the switch circuits 68-1, 70-1. At the same time as this, data necessary for the subsequent writing operation is propagated in the writing data lines 60-2, 60-4. By these parallel operations, in the next cycle, the local data buffers 66-1, 67-1 can immediately take in a writing data through the switch circuits 69-1, 71-1 and write the data into the local data line 65-1 inside the memory cell array. The local data line 65-1 and the local data buffers 66-1, 67-1 are a bi-directional route. For this reason, within one cycle, only either of reading or writing can be executed. Thus, allowing the local data buffers to operate at high speed can highly speed up the operation of the whole semiconductor memory.

For this purpose, it is necessary to allow the writing data lines 60-2, 60-4 and the reading data lines 60-1, 60-3 to operate simultaneously. On this occasion, the capacity coupling of the writing data lines 60-2, 60-4 and the reading data lines 60-1, 60-3 creates a problem. Particularly, when the driving capabilities of the drivers 63-1, 63-2 connected to the writing data lines 60-2, 60-4 are large, it becomes difficult to stably operate the sense amplifiers 62-1, 62-2 connected to the writing data lines 60-1, 60-3 due to the operations of these drivers 63-1, 63-2.

Hence, in the seventh embodiment, at intervals of a predetermined distance of the writing date lines 60-2, 60-4, for example, at the position of approximately ½ of the total length, the amplifiers 61-1, 61-2 are inserted and connected. These amplifiers are constituted by, for example, one inverter circuit. The writing data outputted from output terminals of the amplifiers 61-1, 61-2 are reversed. For this reason, the local data buffers DB corresponding to the memory cell arrays 64-3, 64-4 arranged further backward than the amplifiers 61-1, 61-2 have reverse input terminals and receive the writing data by reversing it again.

On the other hand, the reading data lines 60-1, 60-3 are not provided with the amplifier in the middle of the wiring. The reason why is because it is advisable for the reading data lines 60-1, 60-3 to be constituted by the wired logic connected with a plurality of local data buffers in order to realize high speed operation.

According to the seventh embodiment, at a position of approximately ½ of the total length of the writing data lines 60-2, 60-4 within the writing data lines 60-2, 60-4 and the reading data lines 60-1, 60-3 which are adjacently arranged, the amplifiers 6-1, 61-2 are inserted and connected. For this reason, the capacity couplings of the writing data lines 60-2, 60-4 and the reading data lines 60-1, 60-3 can be offset. Accordingly, the writing data and the reading data can be propagated at high speed and the semiconductor memory can be operated at high speed.

(Eighth Embodiment)

Figure 12:
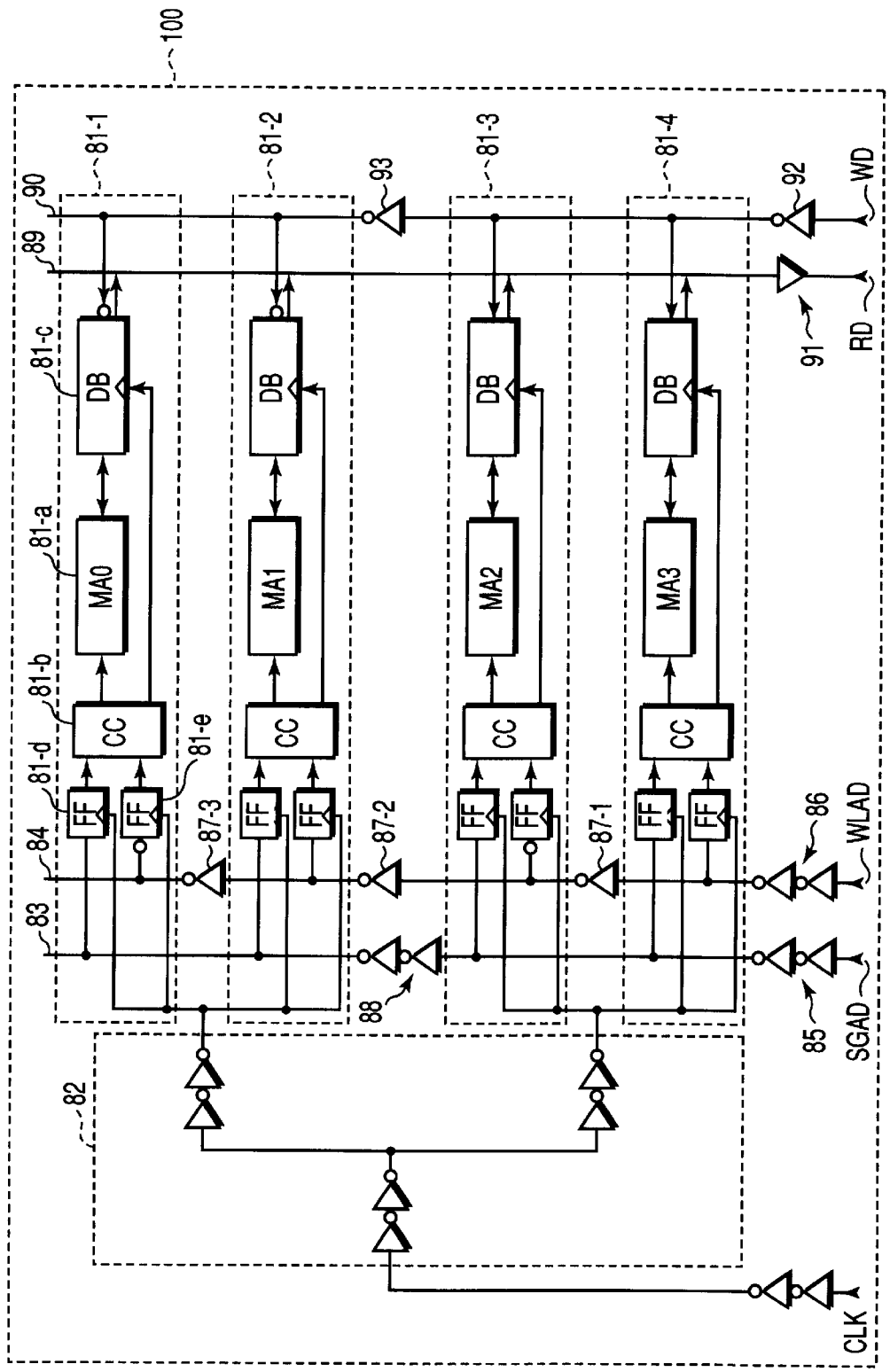
FIG. 12 is a circuit diagram showing an eighth embodiment of the present invention.

FIG. 12 shows an eighth embodiment of the present invention. In the eighth embodiment, the semiconductor memory has, for example, four memory macros 81-1, 81-2, 81-3, 81-4. These memory macros 81-1 to 81-4 are arranged on a semiconductor chip 100. In the arrangement direction of these memory macros 81-1 to 81-4, a segment selection line 83, a word line selection line 84, a reading data line 89 and a writing data line 90 are arranged. The segment selection line 83 is supplied with a segment address signal SGAD for selecting a memory macro through a driver 85. The word line selection line 84 is supplied with a word line address signal WLAD for selecting a word line through a driver 86. The reading data line 89 propagates a reading data. This reading data line 89 is connected to a sense amplifier 91. The reading data line 90 is supplied with a writing data WD through a driver 92.

The constitutions of the memory macros 81-1 to 81-4 are the same. The memory macro 81-1 alone will be described below in relation to its constitution. This memory macro 81-1 has, for example, a memory cell array 81-a, a control circuit 81-b, a data buffer 81-c and flip flop circuits 81-d, 81-e. The memory cell array 81-a is constituted by, for example, a dynamic RAM, but it is not limited to this. The data buffer 81-c is connected to the memory cell array 81-a and the reading data line 89, the writing data line 90. This data buffer 81-c amplifies the data read from the memory cell array 81-a and supplies it to the reading data line 89 or receives a writing data from the writing data line 90 and supplies it to the memory cell array 81-a.

The flip flop circuit 81-d receives the segment address signal SGAD from the segment selection line 83 and supplies it to the control circuit 81-b. A flip flop circuit 81-e receives the word line address signal WLAD from the word line selection line 84 and supplies it to the control circuit 81-b. These flip flop circuits 81-d, 81-e are supplied with a clock signal CLK through a clock line 82 having a tree structure. The control circuit 81-b controls the operations of the memory cell array 81-a and the data buffer 81-c according to the segment address signal SGAD and the word line address signal WLAD.

The segment selection line 83 and the word line selection line 84 are arranged approximately in parallel, and they have the same wiring length. The segment selection line 83 and word line selection line 84 are arranged next to each other and therefore have a capacity coupling.

Hence, at intervals of a predetermined distance of the world line selection line 84, for example, at the positions of approximately ¼, 2/4 and ¾ of the total length, amplifiers 87-1, 87-2, 87-3 are inserted and connected. These amplifiers 87-1, 87-2, 87-3 are constituted by an odd number of, for example, one inverter circuits. Also, at intervals of a predetermined distance of the segment selection line 83, for example, at the position of approximately ½ of the total length, an amplifier 88 is inserted and connected. This amplifier 88 is constituted by an even number of, for example, two inverter circuits. The amplifiers 87-1, 87-2, 87-3 and 88 offset the capacity coupling between the segment selection line 83 and the word line selection line 84, and reduce a signal delay. Furthermore, since the fluctuation of the delay time can be controlled by the amplifiers 87-1, 87-2, 87-3 and 88, each address signal can be propagated at high speed.

On the other hand, the reading data line 89 and the writing data line 90 are arranged approximately in parallel, and they have the same wiring length. These reading data line 89 and the writing data line 90 are arranged next to each other and therefore have the capacity coupling.

Hence, at intervals of a predetermine distance of the writing data line 90, for example, at the position of approximately ½ of the total length, an amplifier 93 is inserted. This amplifier 93 is constituted by the odd number of, for example, one inverter circuit. The reading data line 89 is not provided with an amplifier. The data buffer 81-c of the memory macros 81-1, 81-2 is connected to the writing data line 90 arranged further backward than the output terminal of the amplifier 93, and the data buffer 81-c of the memory macros 81-3, 81-4 is connected to the writing data line 90 arranged further forward than the input terminal of the amplifier 93.

In this way, by connecting the amplifier 93 to the writing data line 90, the delay time of the signal propagated in these data lines and the fluctuation of the delay time can be reduced. Accordingly, the writing data and the reading data can be propagated at high speed.

Further, the characteristic of the eighth embodiment is that four memory macros operate by mutually establishing synchronization. The operation timing of each memory macro is controlled by the clock line 82 having a tree structure. By using the clock line 82 having a tree structure, deviations in the delay time of the signal in the terminal of the clock line 82 hardly occur.

In general, the locally arranged circuits are small enough in the delay of the wirings mutually linking the circuits, so that each circuit can be operated at very high speed. Accordingly, what is important for realizing high speed operation is to control the circulation delay of a signal which occurs in long wiring, and the fluctuation of delay time. This is because the deviation in the timing between the signal propagated in the long wiring and the clock signal prevents the flip flop circuits from being operated at high speed.

However, according to the eighth embodiment, as described above, by arranging the amplifiers 87-1, 87-2, 87-3, 88, 89 in the segment selection line 83 and the word line selection line 84 in which the address signal is propagated and the reading data line 89 and the writing data line 90 in which the data is propagated, the capacity coupling between mutually adjacent wirings can be reduced, and the delay of the signal can be reduced. Accordingly, a semiconductor memory having a plurality of memory macros can be operated at high speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a plurality of wirings which are arranged approximately in parallel and propagate a signal;
   a first amplifier arranged in one wiring of two adjacent wirings which are included in a plurality of wirings, the first amplifier being arranged at least at a position which divides the interval of a predetermined distance of one wiring by 1/n, n being an integer of two or more, and being constituted by an odd number of inverter circuits; and
   a second amplifier arranged in another wiring of two adjacent wirings, the second amplifier being arranged at least at a position which divides the interval of a predetermined distance of the other wiring by 1/n and being constituted by an even number of inverter circuits.

2. The device according to claim 1, wherein each wiring has a parasite capacity and a mutual interval between respective wirings has an inter-wiring parasitic capacitance.

3. The device according to claim 1, further comprising:
   a first driver provided in the other wiring, the first driver driving the other wiring;
   a second driver provided in one wiring, the second driver having a current drive capacity of 1/n of the first driver; and
   wherein the first amplifier has at least the current drive capacity of 1/n of the first driver.

4. A semiconductor device comprising:
   a first memory cell array having a plurality of memory cells;
   a second memory cell array having a plurality of memory cells;
   a plurality of first wirings arranged approximately in parallel, the first wirings propagating an address signal for selecting a memory cell of the first and second memory cell arrays;
   a first decoder connected between the first memory cell array and the first wirings, the first decoder decoding the address signal propagated in the first wirings;

a second decoder connected between the second memory cell array and first wirings, the second decoder decoding the address signal propagated in the first wirings;

a first amplifier arranged at one of the first two adjacent wirings included in the first wirings, the first amplifier being arranged at least at a position which divides the interval of a predetermined distance of one of the first wirings by approximately 1/n, n being an integer of two or more, and being constituted by an odd number of inverter circuits;

a first driver provided in the other first wiring of the adjacent two first wirings, the first driver driving the other first wiring;

a second driver provided in the first one wiring, the second driver having a current drive capacity of 1/n of the first driver which drives the first one wiring; and wherein the first amplifier has a current drive capacity of at least 1/n of the first driver.

5. The device according to claim 4, wherein each first wiring has a parasitic capacity and the mutual interval between respective first wirings has an inter-wiring parasitic capacitance.

6. The device according to claim 4, further comprising a second amplifier arranged in the other first wiring, the second amplifier being arranged at least at a position which divides the interval of a predetermined distance of first other wiring by approximately 1/n and being constituted by an even number of inverter circuits.

7. The device according to claim 4, wherein the input terminals of first decoder are connected to the first one wirings positioned at the input side of the first amplifier, and input terminals of the second decoder are connected to the other first wirings positioned at the output side of the first amplifier.

8. The device according to claim 7, further comprising:

a second wiring arranged adjacent to the other first wiring, the second wiring propagating a decoding signal for correcting the logic of an address signal;

a third amplifier arranged at least at a position which divides the interval of a predetermined distance of the second wiring by approximately 1/n, the third amplifier being constituted by an odd number of inverter circuits;

a third decoder in which the output terminal is connected to the input terminal of the first decoder; and a fourth decoder in which the output terminal is connected to the input terminal of the second decoder, wherein input terminals of third decoder are connected to the first one wiring and second wiring positioned at the input side of the third amplifier, and input terminals of the fourth decoder are connected to the first one wiring and second wiring positioned at the output side of the first and third amplifiers.

9. A semiconductor device comprising:

a first memory cell array having a plurality of memory cells;

a second memory cell array having a plurality of memory cells;

a first data line arranged corresponding to the first and second memory cell arrays;

a second data line arranged approximately in parallel to the first data line;

a first switch which connects the first data line to the first memory cell array;

a second switch which connects the first data line to the second memory cell array;

a third switch which connects the second data line to the first memory cell array;

a fourth switch which connects the second data line to the second memory cell array; and an amplifier arranged at least at a position which divides the interval of a predetermined distance of the second data line by approximate in 1/n, n being an integer of two or more, the amplifier being constituted by an odd number of inverter circuits, wherein the first and third switches are connected to the input side of the amplifier, and the second and fourth switches are connected to the output side of the amplifier.

10. The device according to claim 9, wherein the first and second data lines have a parasitic capacitance and the interval between first and second data lines have an inter-wiring parasite capacity.

11. The device according to claim 9, wherein the first data line propagates data read from one of the first and second memory cell arrays.

12. The device according to claim 9, wherein the second data line propagates data written in either one of the first and second memory cell arrays.

13. A semiconductor device comprising:

a plurality of memory macros arranged on a semiconductor chip, each memory macro having a memory cell array;

a first address wiring shared by a plurality of memory macros;

a second address wiring arranged approximately in parallel to the first address line;

a first amplifier arranged at least at a position which divides the interval of a predetermined distance of the first address wiring by approximately 1/n, n being an integer of two or more, the first amplifier being constituted by an odd number of inverter circuits; and a second amplifier arranged at least at a position which divides the interval of a predetermined distance of second address wiring by approximately 1/n, the second amplifier being constituted by an even number of inverter circuits.

14. The device according to claim 13, further comprising:

a first data wiring shared by the plurality of memory macros; and a second data line arranged approximately in parallel to the first data wiring.

15. The device according to claim 14, further comprising a third amplifier arranged at least at a position which divides the interval of a predetermined distance of the second data line by approximately 1/n, the third amplifier being constituted by an odd number of inverter circuits.

16. The device according to claim 14, wherein the first data wiring propagates data read from each memory macro, and the second data line propagates data written in each memory macro.

17. The device according to claim 14, further comprising a clock wiring which is connected to the memory macro and propagates a clock signal, the clock, the clock wiring having a tree structure.

* * * * *